United States Patent
Takagi

(10) Patent No.: US 7,303,402 B2
(45) Date of Patent: Dec. 4, 2007

(54) CONNECTOR, METHOD FOR MANUFACTURING THE SAME, AND WIRING BOARD STRUCTURE EMPLOYING IT

(75) Inventor: Yoshikazu Takagi, Aichi (JP)

(73) Assignee: J.S.T. Mfg. Co., Ltd, Osaka (JP)

( * ) Notice: Subject to any disclaimer, the term of this patent is extended or adjusted under 35 U.S.C. 154(b) by 0 days.

(21) Appl. No.: 10/520,162

(22) PCT Filed: Jul. 4, 2003

(86) PCT No.: PCT/JP03/08541

§ 371 (c)(1),
(2), (4) Date: Oct. 7, 2005

(87) PCT Pub. No.: WO2004/006389

PCT Pub. Date: Jan. 15, 2004

(65) Prior Publication Data

US 2006/0105587 A1    May 18, 2006

(30) Foreign Application Priority Data

Jul. 5, 2002    (JP)    ............................ 2002-197020

(51) Int. Cl.
*H01R 12/00* (2006.01)
(52) U.S. Cl. .......................................... 439/66; 439/74
(58) Field of Classification Search .................. 439/66, 439/67, 74
See application file for complete search history.

(56) References Cited

U.S. PATENT DOCUMENTS 5,162,613 A    11/1992    Schoenthaler
6,213,784 B1    4/2001    Cairoli et al.
6,332,786 B1    12/2001    Suga et al.

FOREIGN PATENT DOCUMENTS

| JP | 61-016884 U | 1/1986 |
|---|---|---|
| JP | 63-061704 U | 4/1988 |
| JP | 04-116374 U | 10/1992 |
| JP | 07-282878 A | 10/1995 |
| JP | 11-020360 A | 1/1999 |
| JP | 2001-210933 A | 8/2001 |

OTHER PUBLICATIONS

Internaional Search Report mailed on Aug. 12, 2003.
Supplementary European Search Report, Ref. JSTF-011EPUr/an, App. No. 03762886.4-1231 PCT/JP0308541, Mar. 1, 2007 (3 pages).

*Primary Examiner*—Khiem Nguyen
(74) *Attorney, Agent, or Firm*—Rader, Fishman & Grauer, PLLC

(57) ABSTRACT

The invention relates to a connector for interconnecting an plurality of wiring boards, a method for manufacturing the same, and a wiring board structure employing the connector. The connector has a base member having no conductivity and a conductive wire provided on a surface of the base member, and is arranged so as to be connectable to a wiring board, comprising: a conductive pressing member provided on and protruding from the wire; and a holding member provided on and protruding from a portion in the surface of the base member except where the pressing member is located, the holding member having an affixing surface attachable to the wiring board. The invention can make the wire provided on a surface of the wiring board flat, and therefore it becomes possible to secure the flexibility in designing a wiring pattern of a wiring board.

16 Claims, 11 Drawing Sheets

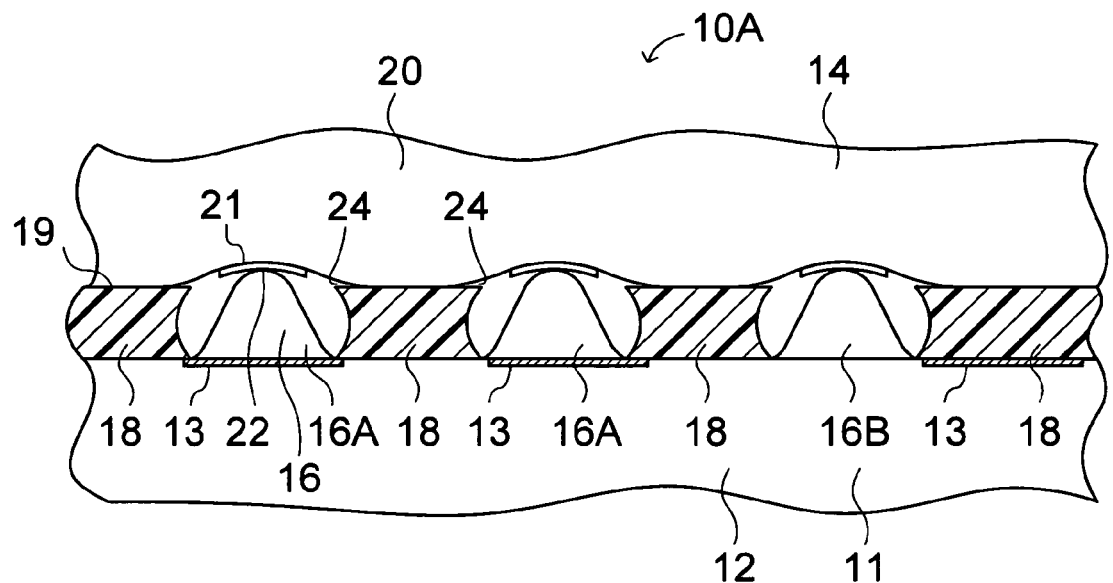
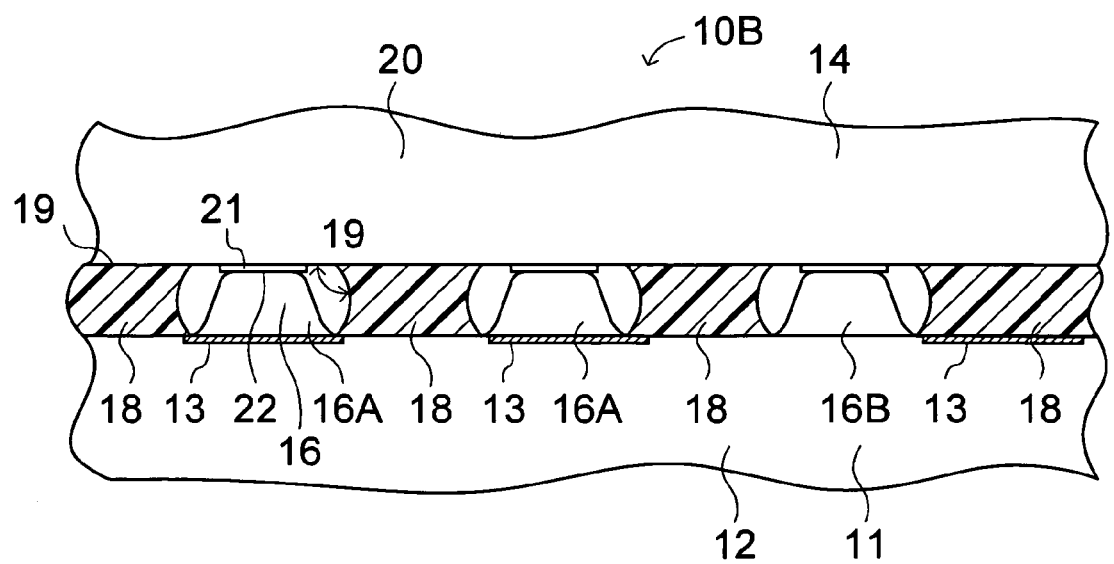

Fig. 17 A
Fig. 17 B
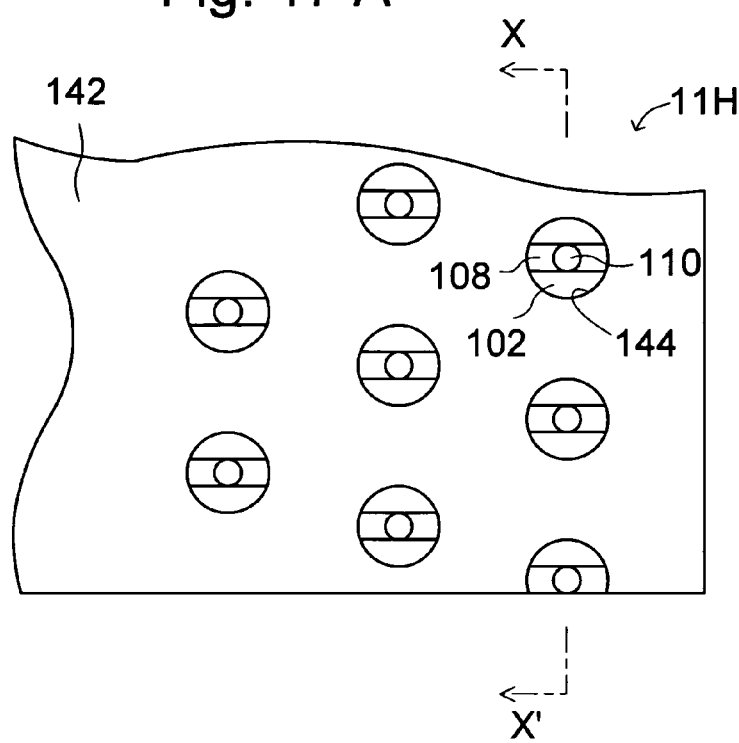
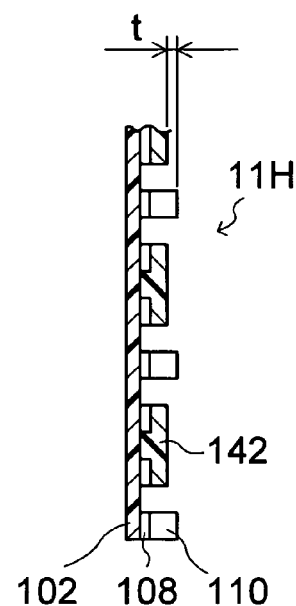
Fig. 18 A
Fig. 18 B
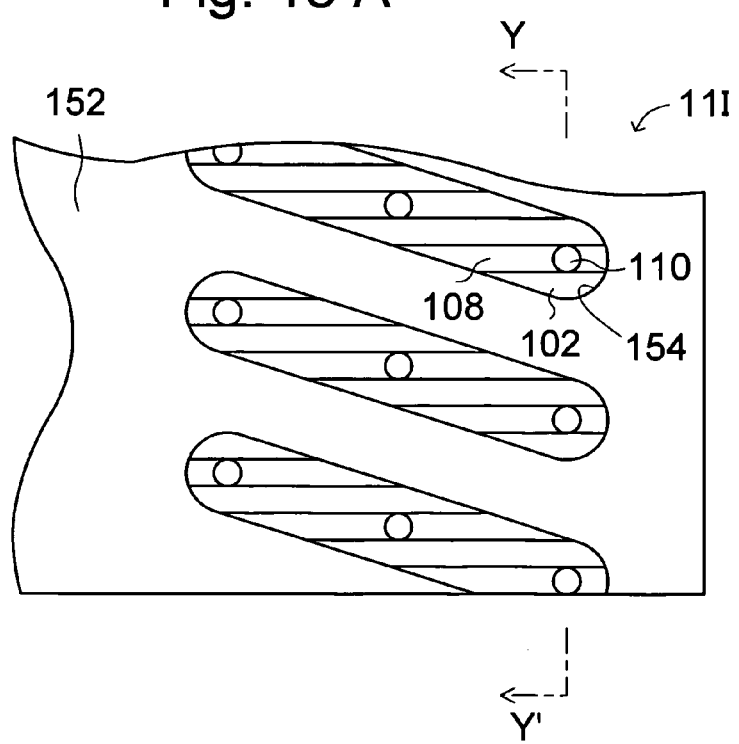
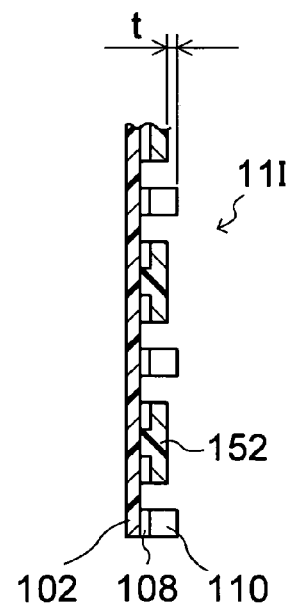

CONNECTOR, METHOD FOR MANUFACTURING THE SAME, AND WIRING BOARD STRUCTURE EMPLOYING IT

FIELD OF THE INVENTION

The present invention relates to a connector for interconnecting a plurality of wiring boards, a method for manufacturing the same, and a wiring board structure employing the connector.

BACKGROUND ART

Conventionally, electronic equipment has a plurality of wiring materials in the inside thereof, and connectors have been known as a means to interconnect such wiring bases.

For example, as a wiring board structure with such connector, there has been known a structure disclosed by JP-A-2001-210933. More specifically, the connector comprises: a base member; a sticky layer provided over an entire surface of the base member; and a wire provided on a surface of the sticky layer protruding therefrom. Here, the wire of the connector are in the form of a plurality of straight lines mutually in parallel. On the other hand, the wiring material comprises: a base member with a plurality of grooves formed thereon mutually in parallel; and a wire provided on the bottom faces of the grooves of the base member. Therefore, the wire on a portion of the wiring material to be connected to the connector (hereinafter referred to as a connector-connecting portion) are also in the form of a plurality of straight lines mutually in parallel.

These two identical wiring materials are disposed side by side, and then the connector is mounted astride connector-connecting portions of the two wiring materials. In other words, the protruding wires of the connector are fitted in the grooves in the wiring board. Thus, the wires of the connector can be connected to the wires on each wiring board, and the sticky layer of the connector stuck to the base member of the wiring material can prevent relative displacement of the connector.

However, in order to fit the connector in the wiring material, the above-described wiring board structure required that the wires of the connector-connecting portion and the wires of the connector take the form of a plurality of straight lines mutually in parallel. As a result, the flexibility in designing a wiring pattern was reduced.

DISCLOSURE OF THE INVENTION

Therefore, the present invention has as its object to provide a connector which can secure the flexibility in designing a wiring pattern of a wiring board, a method for manufacturing the connector, and a wiring board structure employing the connector.

In the above-described prior art, the flexibility in designing a wiring pattern of a wiring board was restricted because it is required that the wiring patterns of the connector and wiring board be in the form of a plurality of straight lines mutually in parallel. The applicant found out that when a pressing member higher than a surface of a base member is provided on a connector wire and a wire of the wiring board are formed substantially at the same level as the surface of the base member, the flexibility of a wiring pattern for the wiring board could be improved.

However, the structure as described above makes it difficult to mount a connector on a wiring board because the sticky layer of the connector does not touch a surface of the wiring board.

Therefore, for achieving the above conflicting requirements, the applicant focused on a portion in the surface of the base member of the connector except where a wire is located and devised the utilization of a space between the portion and the wiring board. Specifically, a holding member is provided on a portion in the surface of the base member of the connector except where the wire is located.

More specifically, the present invention provides the following.

(1) A connector which is connectable to a wiring board and has a base member having no conductivity and a conductive wire provided on a surface of the base member, the connector characterized by comprising: a pressing member having a conductivity provided on and protruding from the wire; and a holding member provided on and protruding from a portion in the surface of the base member except where the pressing member is located, the holding member having an affixing surface attachable to the wiring board.

Herein, the wire and pressing member, which have conductivity, are formed with materials having a high electrical conductivity (i.e. a low electric resistance). Such conductive materials include: metal materials such as copper, silver, and aluminum; organic materials such as conductive polymer and carbon; inorganic materials such as ceramics including oxides; and combinations among them. Among these materials, a metal material having a high electrical conductivity and an organic material having a relatively low modulus of elasticity are especially preferable as the conductive materials.

On the other hand, the base member having no conductivity is formed with a non-conductive material having a low electric conductivity (i.e. a high electric resistance). Such non-conductive materials include organic materials such as Bakelite, and inorganic materials such as glass.

The wiring board is constituted comprising, for example, a base member in the form of a plate, and a wire formed on at least one surface of the base member.

The pressing member may partially have non-conductivity, so far as it has the conductivity a whole. In addition, the pressing member may be provided with a spring and such in its inside.

The holding member may be provided on the entire surface of the base member except where the pressing member is located, or shaped into a small rectangle or circle and scattered on the surface of the base member. This holding member may be attached on the surface of the base member of the connector by sticking, adhesion, etc.

Materials, from which the pressing member and holding member are to be formed, and their heights may be decided appropriately.

According to this invention, a connector is constituted comprising a base member, a wire, a pressing member, and a holding member. A wiring board is constituted, for example, comprising a base member and a wire. Then, the connector is faced to and superposed on the wiring board. This causes the pressing member of the connector to be brought into contact with the wire on the wiring board, electrically connecting the wire of the connector to the wire on the wiring board through the pressing member. At this time, the holding member has been provided on a portion except where the pressing member is located such that the pressing member can be brought into contact with the wiring board reliably. Therefore, the wire provided on a surface of the wiring board can be made flat so that it becomes possible to secure the flexibility in designing a wiring pattern of a wiring board.

In addition, since the holding member of the connector is attached to the wiring board, the relative displacement between the connector and wiring board can be prevented so that the connector can be reliably connected to the wiring board.

(2) The connector described above, wherein the pressing member is elastically deformable, and the holding member is lower than the pressing member in height and arranged to be elastically deformable.

According to this invention, the connector is connected to the wiring board by the following procedures. First, the connector is faced to the wiring board and then a pressing force is applied to the connector, whereby the pressing member of the connector is pressed on the wire on the wiring board and brought into close contact with the wire on the wiring board while being deformed elastically. When the pressing force is continuously applied to the connector as it is, the pressing member of the connector is elastically deformed so that the distance between the connector and wiring board is shortened and thus the holding member of the connector is brought into contact with the base member of the wiring board.

Thereafter, when the pressing force applied to the connector is released, the pressing member of the connector presses the wiring board by its elastically restoring force in the direction to separate the wiring board from the connector. Then, the wiring board thus pressed and moved pulls and stretches the holding member of the connector toward the wiring board. This produces, in the holding member, an elastically restoring force to pull the wiring board in the direction to bring the wiring board near to the connector. The pressing member and the holding member cause opposite forces to act on the wiring board and on the connector in this way such that, among the base member of the wiring board, the base member of the connector, the pressing member and the holding member, a member having a lower rigidity is to be subjected to deformation.

Finally, when the pressing force produced by the pressing member and the pulling force derived from the holding member are equalized, the deformation of the connector and wiring board is completed and the distance between the connector and wiring board is kept constant. Therefore, a good connecting condition can be achieved.

For example, when the rigidities of base members of the connector and wiring board are lower than those of the pressing member and holding member, the connector base member and wiring board base member are deformed. Further, herein when the rigidity of the connector base member is lower than that of the wiring board base member, the connector will be deformed. In contrast, when the rigidity of the wiring board base member is lower than that of the connector base member, the wiring board will be deformed. In addition, when the connector base member and the wiring board base member are identical in rigidity, both the connector and wiring board will be deformed.

Further, when the rigidities of the connector base member and wiring board base member are higher compared to those of the pressing member and holding member, the pressing member and holding member are deformed.

(3) The connector described above, wherein the affixing surface of the holding member is dented.

According to this invention, the holding member can stick to the wiring board like a sucking disc. Therefore, the connector can be held on the wiring board more reliably.

(4) The connector described above, wherein the affixing surface of the holding member is made it possible to stick to the wiring board.

To the affixing surface is applied, for example, a silicone-based or acrylic-based adhesive material. Specifically, the adhesive material containing at least one of YR3286 and YR3340 (trade names) manufactured by GE Toshiba Silicone Co., Ltd is preferable.

(5) The connector described above, wherein the affixing surface of the holding member is made attachable to and removable from the wiring board.

According to this invention, "being attachable to and removable from" means that the affixing surface can be attached to and removed from the wiring board at least not less than two times.

For example, a predetermined paste ingredient may be applied to the affixing surface so as to make it attachable and removable. The paste ingredient may be the one sensitive to a chemical stimulation, or the one responsive to a change in temperature like a hotmelt. Also, a structure in which the pressing member and the holding member change in their heights in response to a chemical stimulation or a temperature change may be adopted.

(6) The connector described above, wherein the affixing surface of the holding member is made engageable with the wiring board.

The engagement herein may include a mechanical bonding between a hook and a loop as in the case of, for example, a Magic Tape®.

(7) A wiring board structure having a wiring board and a connector to be connected to the wiring board characterized in that the connector comprises: a base member having no conductivity; a conductive wire provided on a surface of the base member; a conductive pressing member provided on and protruding from the wire; and a holding member provided on and protruding from a portion in the surface of the base member except where the pressing member is located, the holding member having an affixing surface attachable to the wiring board, that the wiring board comprises: a base member having no conductivity and a conductive wire provided on a surface of the base member, and that when the connector is faced to and superposed on the wiring board, the pressing member of the connector is brought into contact with the wire on the wiring board, and the holding member is attached to the wiring board.

Herein, the wiring board is electrically connected to the connector described above. The wire of the wiring board may be formed on its substrate by printing and such, two-dimensionally or stereoscopically.

(8) The wiring board structure described above, wherein the holding member becomes larger in width as it gets closer to the affixing surface.

According to this invention, a large contact area of the affixing surface with the wiring board can be ensured.

(9) The wiring board structure described above, wherein when the holding member pulls the wiring board, the pressing member is compressed by the connector and the wiring board.

(10) The wiring board structure described above, wherein when the pressing member presses on the wiring board, the holding member is pulled by the connector and the wiring board and stretched.

Herein, the contact pressure of the pressing member and wiring board depends on a pressing force of the pressing member to the wiring board and a pulling force with which the holding member pulls the wiring board as well as physical properties of the pressing member and wiring board.

(11) The wiring board structure described above, wherein the connector is deformed when the pressing member presses on the wiring board and the holding member pulls the wiring board.

(12) The wiring board structure described above, wherein the wiring board is deformed when the pressing member presses on the wiring board, and the holding member pulls the wiring board.

(13) A method for manufacturing a connector which is connectable to a wiring board consisting of a base member having no conductivity and a conductive wire provided on a surface of the base member, comprising the steps of: forming the base member from an elastomer; forming the wire on the base member from a conductive material with a given pattern; forming a mask layer on the wire; disposing a mask die having openings in predetermined places on the mask layer; forming a pressing member having a conductivity on the wire so as to protrude therefrom by irradiating a light for removing the mask layer from above the mask die to remove the mask die by etching; forming a sticky layer over the entire surface of the base member; disposing a mask die for covering a portion of the sticky layer except where the pressing member is located, and forming a holding member having an affixing surface attachable to the wiring board on a portion in the surface of the base member except where the pressing member is located so as to protrude therefrom by irradiating a light for removing the mask layer to remove the mask die by etching.

BRIEF DESCRIPTION OF THE DRAWINGS

FIG. 6 is a cross-sectional view showing a wiring board structure according to a second embodiment of the present invention FIG. 7 is a cross-sectional view showing a wiring board structure according to a third embodiment of the present invention

FIG. 17A is a plan view showing a connector according to a ninth embodiment of the present invention FIG. 17B is a cross-sectional view taken along the line X-X' in FIG. 17A.

FIG. 18A is a plan view showing a connector according to a tenth embodiment of the present invention FIG. 18B is a cross-sectional view taken along the line Y-Y' in FIG. 17A.

EMBODIMENT FOR CARRYING OUT THE INVENTION

The embodiments of the invention will be described below with reference to the drawings. In the descriptions below, like reference symbols are used to refer to like elements throughout and a description thereof is omitted or simplified.

First Embodiment

Figure 1:
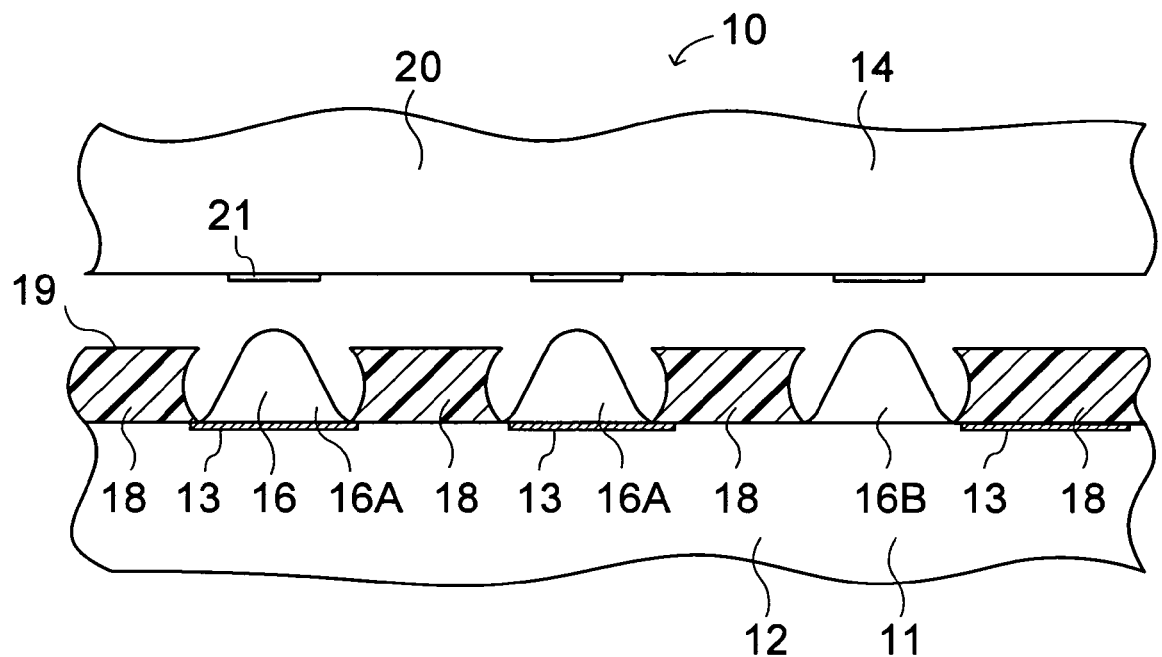
FIG. 1 is a cross-sectional view showing a wiring board structure according to a first embodiment of the present invention.

FIG. 1 shows a schematic cross-sectional view of a wiring board structure 10 according to the first embodiment of the present invention The wiring board structure 10 comprises a wiring board 14 and a connector 11 to be connected to the wiring board 14. The connector 11 comprises a non-conductive base member 12 and conductive wires 13 provided on a surface of the base member 12. Further, this connector 11 is provided with a plurality of pressing members 16 provided on and protruding from a surface of the base member 12; and holding members 18 provided on and protruding from portions in the surface of the base member 12 other than portions where the pressing members 16 are located.

The wiring board also includes a non-conductive base member 20 and conductive wires 21 provided on the surface of the base member 20.

Herein, the rigidity of the base member 12 of the connector 11 is made lower than that of the base member 20 of the wiring board 14 being provided with the pressing members 16 and the holding members 18.

The pressing members 16 are formed with a metal and comprises conductive pressing members 16A disposed on the wires 13 and pressing members 16B that are not disposed on the wires 13. The pressing members 16A, 16B are substantially conical in shape and mounted to the base member 12 with an adhesive at the bottom faces thereof. Herein, shaping each of the pressing members 16A, 16B into a substantial cone makes it possible to ensure a larger contact area for each bottom face thereof with the base member 12, such that the pressing members 16A, 16B can be reliably bonded with the base member 12. In this case, the pressing members 16A, 16B are not limited to being substantially conical in shape, and may take a belt form with a conical cross section.

Each holding member 18 is mounted to the base member 12 with an adhesive. The holding members 18 are in a substantially columnar form, and their bottom and top side portions are wider than their middle portion. The top surface of each holding member will serve as an affixing surface 19 attachable to a wiring board 14. In addition, the holding members 18 are a little lower than the pressing members 16A, 16B in height.

Herein, since the bottom face side portion of each holding member 18 is made wider than the middle portion thereof, a larger contact area of the bottom face of the holding member 18 with the base member 12 can be ensured as in the case of the pressing members 16A, 16B such that the holding members 18 can be bonded with the base member 12 reliably. Also, since the affixing surface 19 of each holding member 18 is made flat, the holding members 18 can be put uniformly in contact with the wiring board 14 described later.

Next, the procedure for connecting the connector 11 to the wiring board 14 will be described.

Figure 2:
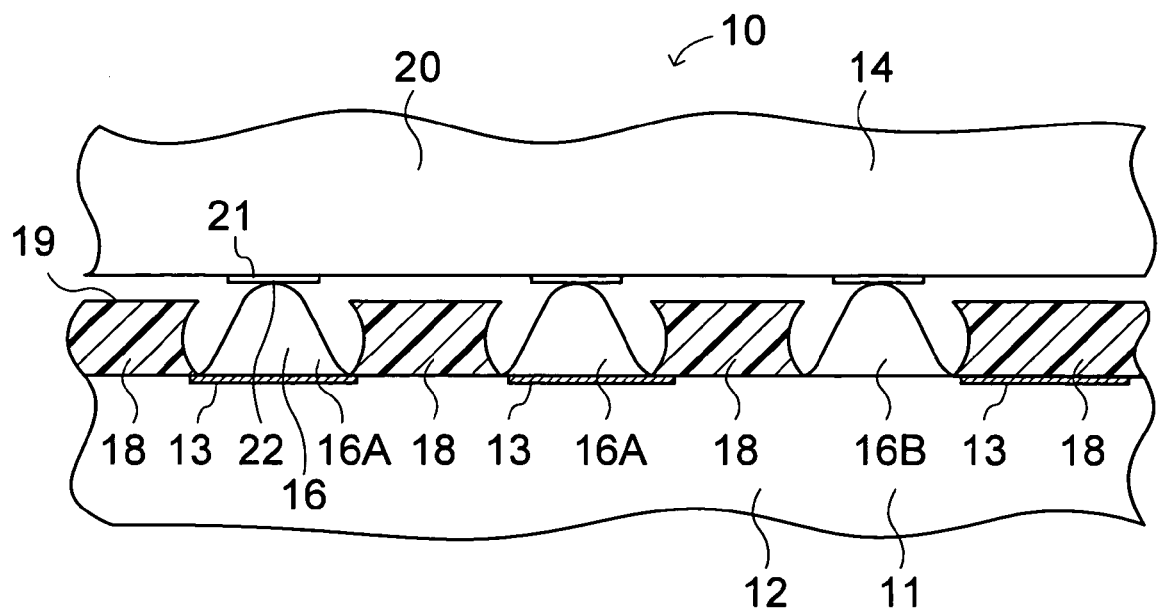
FIG. 2 is a cross-sectional view of the wiring board structure according to the above-described embodiment in the state where pressing members are placed in contact with the wiring board.

First, the connector is faced to and superposed on the wiring board and then a pressing force is applied to the connector, thereby forcing the pressing members 16A, 16B of the connector 11 to abut on the wires 21 on the wiring board 14 as shown in FIG. 2.

While all the pressing members 16A, 16B are simultaneously put in contact with the wiring board 14 in FIG. 2, the invention is not limited such universally simultaneous contact timing, and may have some time differences in contact timing among them. In this case, if some of the pressing members 16A, 16B are brought into contact behind the others, their contact pressures to the wiring board 14 would be made smaller. Hence, the contact pressures are adjusted to become uniform by modifying the height and rigidity of the pressing members 16A, 16B.

When the pressing force is applied to the connector with such an adjustment, the pressing members 16A, 16B of the connector are pressed by the wires 21 on the wiring board 14 and brought into close contact with the wires 21 on the wiring board 14 while being deformed elastically. Thus, the wires 13 of the connector 11 are electrically connected to the wires 21 of the wiring board 14 through the pressing members 16A, 16B.

When the pressing force is further applied, the elastic deformation of the pressing members 16A, 16B of the connector 11 shortens the distance between the connector 11 and wiring board 14 such that the holding members 18 of the connector 11 are brought into contact with the base member 20 of the wiring board 14.

Thereafter, when the pressing force applied to the connector 11 is released, the elastically restoring force produced by the pressing members 16A, 16B of the connector 11 causes the wiring board 14 to be pressed in the direction to separate the wiring board 14 from the connector 11. Then, the moved wiring board 14 pulls and stretches the holding members 18 of the connector 11 toward the wiring board 14. Thus, the holding members 18 produce the elastically restoring force to pull the wiring board 14 in the direction to bring the wiring board near to the connector 11.

Figure 3:
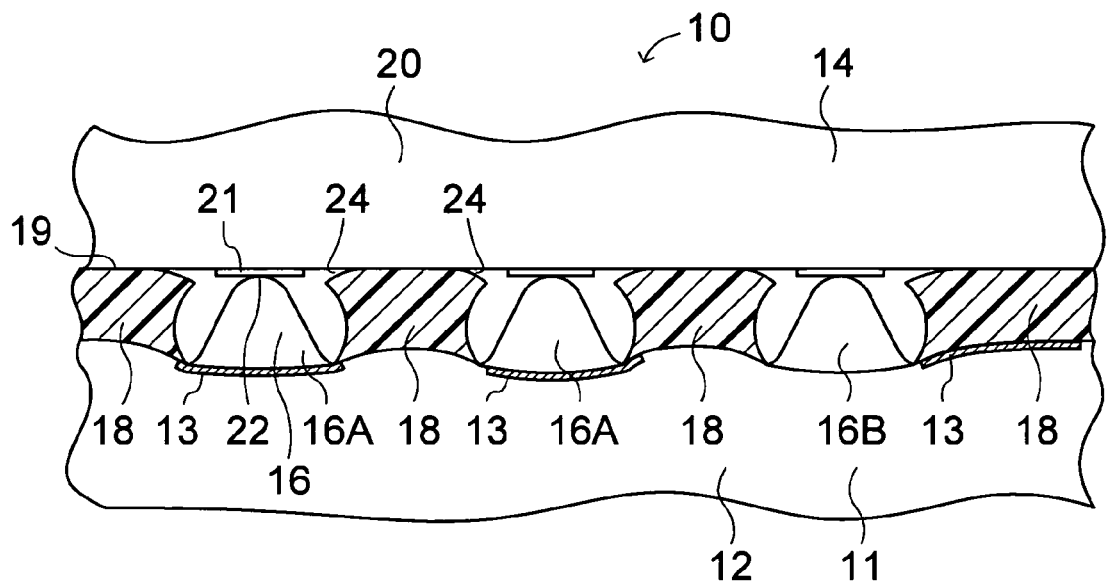
FIG. 3 is a cross-sectional view of the wiring board structure according to the above-described embodiment in the state where a connector is connected to the wiring board.

The rigidity of the base member 12 of the connector 11 at this time is lower than that of the base member 20 of the wiring board 14 having the pressing members 16A, 16B and the holding members 18. Hence, the base member 12 of the connector 11 turns out to undergo a large deformation as shown in FIG. 3.

When the pressing force produced by the pressing members 16A, 16B and the pulling force produced by the holding members 18 are equalized by such deformation, the deformation of the connector 11 and wiring board 14 is completed and the distance between the connector 11 and wiring board 14 is kept constant.

In this case, the base member 12 of the connector 11 is pressed and deformed by the pressing members 16A, 16B, and thus an edge of the affixing surface 19 of each holding member 18 is pulled toward the connector 11 to make a gap slightly.

Next, the procedures for manufacturing the above-described connector 11 will be described.

Figure 4:
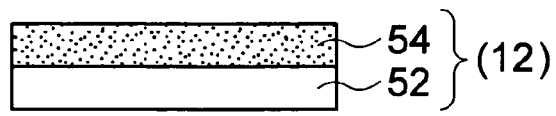
FIG. 4A is a cross-sectional view showing the state where the base member of the connector has been formed in the wiring board structure according to the embodiment.
FIG. 4B is a cross-sectional view showing the state where a wire have been formed on a surface of the base member in the wiring board structure according to the embodiment.
FIG. 4C is a cross-sectional view showing the state where a mask layer has been formed over the wire in the wiring board structure according to the embodiment.
FIG. 4D is a cross-sectional view showing the state where ultraviolet light is irradiated to the mask layer in the wiring board structure according to the embodiment.
FIG. 4E is a cross-sectional view showing the state where the mask layer is partially decomposed in the wiring board structure according to the embodiment.
FIG. 4F is a cross-sectional view showing the state where the mask layer has been partially removed in the wiring board structure according to the embodiment.
FIG. 4G is a cross-sectional view showing the state where the mask die has been removed in the wiring board structure according to the embodiment.
FIG. 4H is a cross-sectional view showing the state where pressing members have been formed in the wiring board structure according to the embodiment.
FIG. 4I is a cross-sectional view showing the state where the mask layer has been removed in the wiring board structure according to the embodiment.
Figure 4:
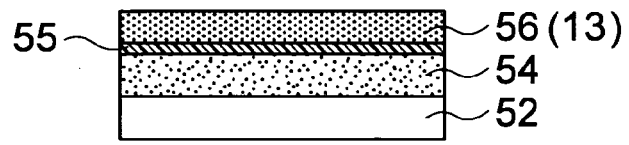
Figure 4:
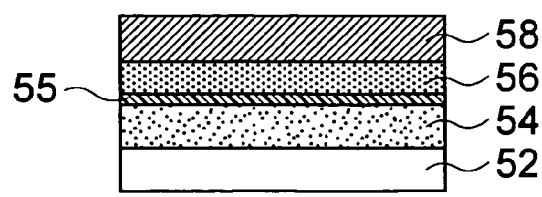
Figure 4:
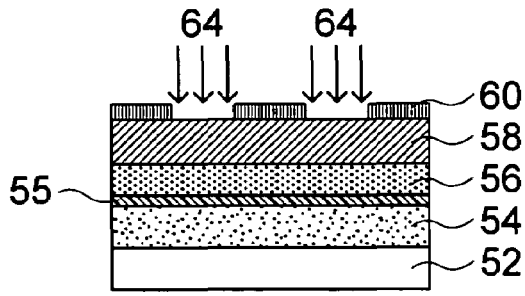
Figure 4:
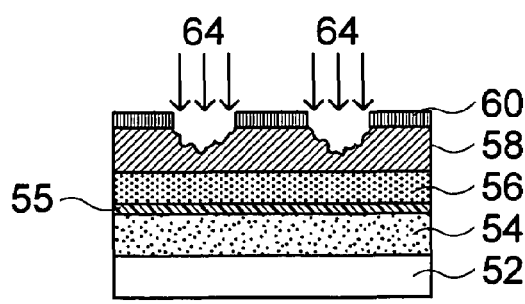
Figure 4:
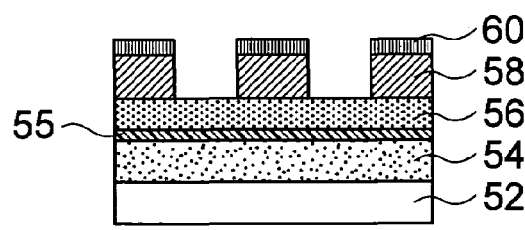
Figure 4:
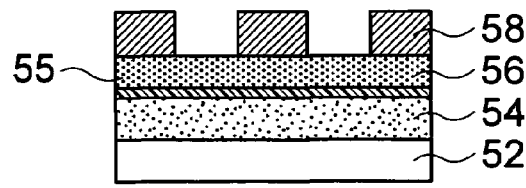
Figure 4:
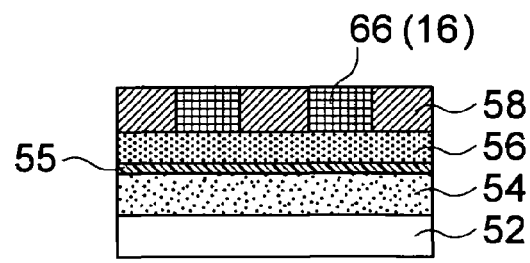
Figure 4:
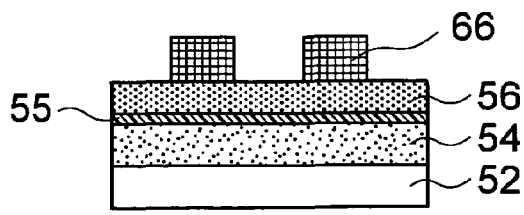

First, the procedure for forming pressing members 16 will be described in reference to FIGS. 4A to 4I. Specifically, an elastomer 54 is provided on a base film 52 (FIG. 4A). This elastomer 54 will become the base member 12 of the connector 11. Then, an adhesive layer 55 is provided on the elastomer 54, followed by gluing thereto a copper foil 56 as a conductive material in given patterns (FIG. 4B). The copper foil 56 will become wires 13.

Subsequently, a mask layer 58 is formed on the copper foil 56 (FIG. 4C). Thereafter a mask die 60 is disposed on the mask layer 58 such that ultraviolet light (UV) 64 is irradiated thereto (FIG. 4D). Thus, a portion of the mask layer 58, which is not covered with the mask die 60, is decomposed by the ultraviolet light 64 (FIG. 4E) and the mask layer 58 is partially removed (FIG. 4F).

Next, the mask die 60 is removed by etching (FIG. 4G). Further, the portions where the copper foil 56 is exposed by removing the mask layer 58 are subjected to pattern-etching thereby to form electroformed pieces 66 (FIG. 4H). The electroformed pieces 66 are usually called bumps, and will become the pressing members 16. Lastly, the mask layer 58 is removed by etching (FIG. 4I).

Figure 5:
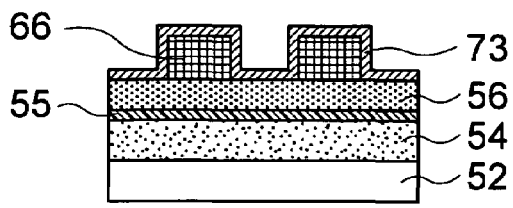
FIG. 5A is a cross-sectional view showing the state where a sticky layer has been formed in the wiring board structure according to the embodiment.
FIG. 5B is a cross-sectional view showing the state where ultraviolet light is irradiated to a mask die disposed on the sticky layer in the wiring board structure according to the embodiment.
FIG. 5C is a cross-sectional view showing the state where the sticky layer is partially decomposed in the wiring board structure according to the embodiment.
FIG. 5D is a cross-sectional view showing the state where the pressing members are exposed in the wiring board structure according to the embodiment.
FIG. 5E is a cross-sectional view showing the state where the mask die has been removed in the wiring board structure according to the embodiment.
FIG. 5F is a cross-sectional view showing the state where the connector has been completed in the wiring board structure according to the embodiment.
Figure 5:
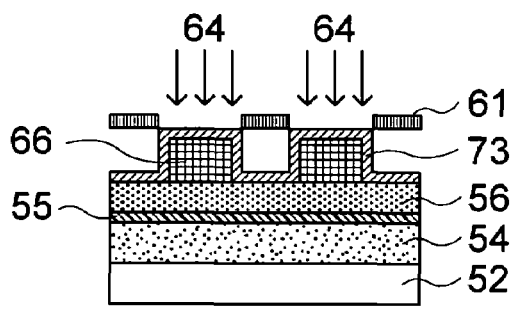
Figure 5:
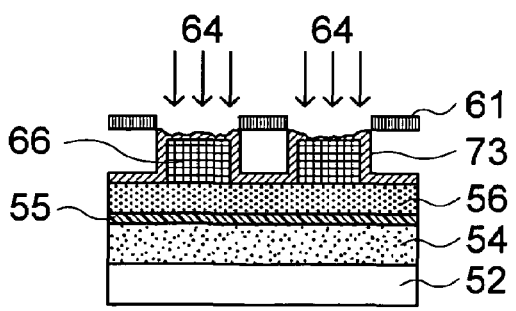
Figure 5:
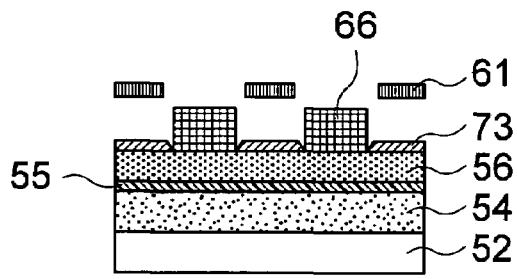
Figure 5:
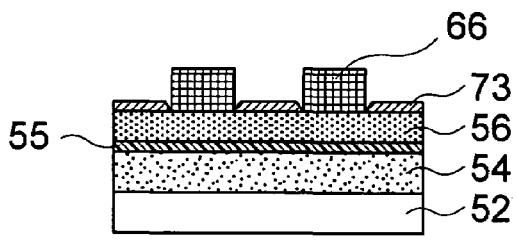
Figure 5:
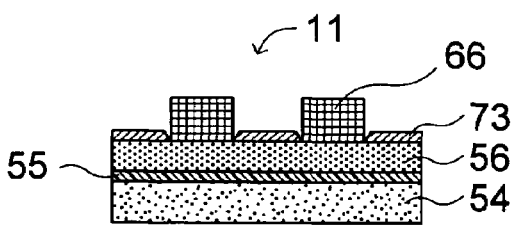

Next, the procedures for forming holding members 18 will be described in reference to FIGS. 5A to 5F. Specifically, a sticky layer 73 of an adhesive material is formed on the copper foil 56 and electroformed pieces 66 over all their surfaces (FIG. 5A). Then, a mask die 61 for covering portions of the sticky layer 73 other than those of the electroformed pieces 66 is disposed to irradiate ultraviolet light 64 thereto (FIG. 5B). Thus, the portions of the sticky layer 73 just above the electroformed pieces 66 are decomposed by the ultraviolet light 64 (FIG. 5C) to expose the electroformed pieces 66 (FIG. 5D). Thereafter the mask die 61 is removed by etching, followed by rinsing the entire workpiece (FIG. 5E). Lastly the base film 52 is removed (FIG. 5F). The connector 11 is thus finished.

Second Embodiment

FIG. 6 shows a cross-sectional view of a wiring structure 10A according to the second embodiment of the present invention This embodiment differs from the first embodiment in that the rigidity of the base member 20 of the wiring board 14 is lower than that of the base member 12 of the connector 11 having the pressing members 16A, 16B and the holding members 18 in the wiring board structure 10A. Hence, in this embodiment, the base member 20 of the wiring board 14 is pressed by the pressing members 16A, 16B to be largely deformed.

In this case, the base member 20 of the wiring board 14 is deformed such that the edge of the affixing surface 19 of each holding member 18 makes a gap slightly.

Third Embodiment

FIG. 7 shows a cross-sectional view of a wiring structure 10B according to the third embodiment of the present invention This embodiment differs from the first embodiment in that the rigidity of pressing members 16A, 16B is lower than that of the base member 12 of the connector 11 having the holding members 18 and the base member 20 of the wiring board 14 in the wiring board structure 10B. Hence, in this embodiment, the pressing members 16A, 16B are compressed by the base member 20 of the wiring board 14 and the base member 12 of the connector 11 to be deformed largely.

Herein, the pressing members 16 are formed with a conductive elastomer. The pressing members are not limited to this material, and each of the pressing members may contain a spring mechanism.

In this embodiment, since the base member 12 of the connector 11 and the base member 20 of the wiring board 14 are not deformed, the edge of the affixing surface 19 of each holding member 18 is in close contact with the wiring board 14. Therefore, according to this embodiment, a large contact area of the affixing surface 19 and the wiring board 14 can be ensured.

Fourth Embodiment

Figure 8:
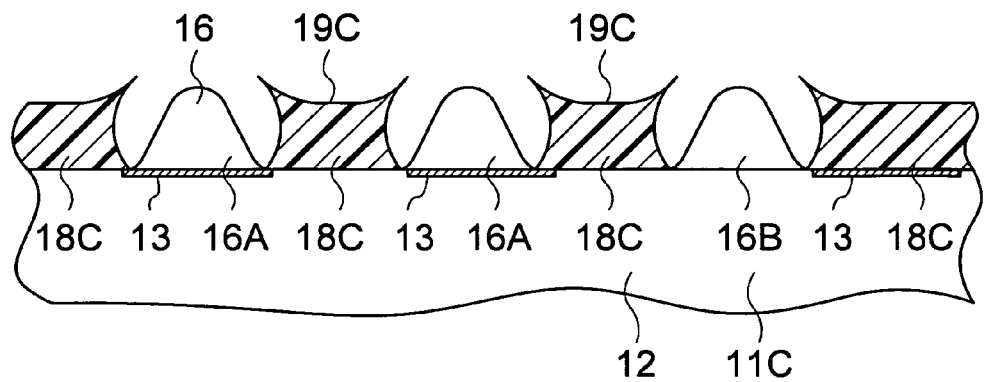
FIG. 8 is a cross-sectional view showing a connector according to a fourth embodiment of the present invention

FIG. 8 shows a cross-sectional view of a connector 11C according to the fourth embodiment of the present invention This embodiment differs from the first embodiment in the shape of the holding members 18C of the connector 11C. That is, the holding members 18C are larger than the pressing members 16 in height and the affixing surface 19C of each holding member is concaved.

Therefore, according to this embodiment, the holding members 18C can adhere to the wiring board like a sucking disc and the connector 11C can be held on the wiring board 14 more reliably.

Fifth Embodiment

Figure 9:
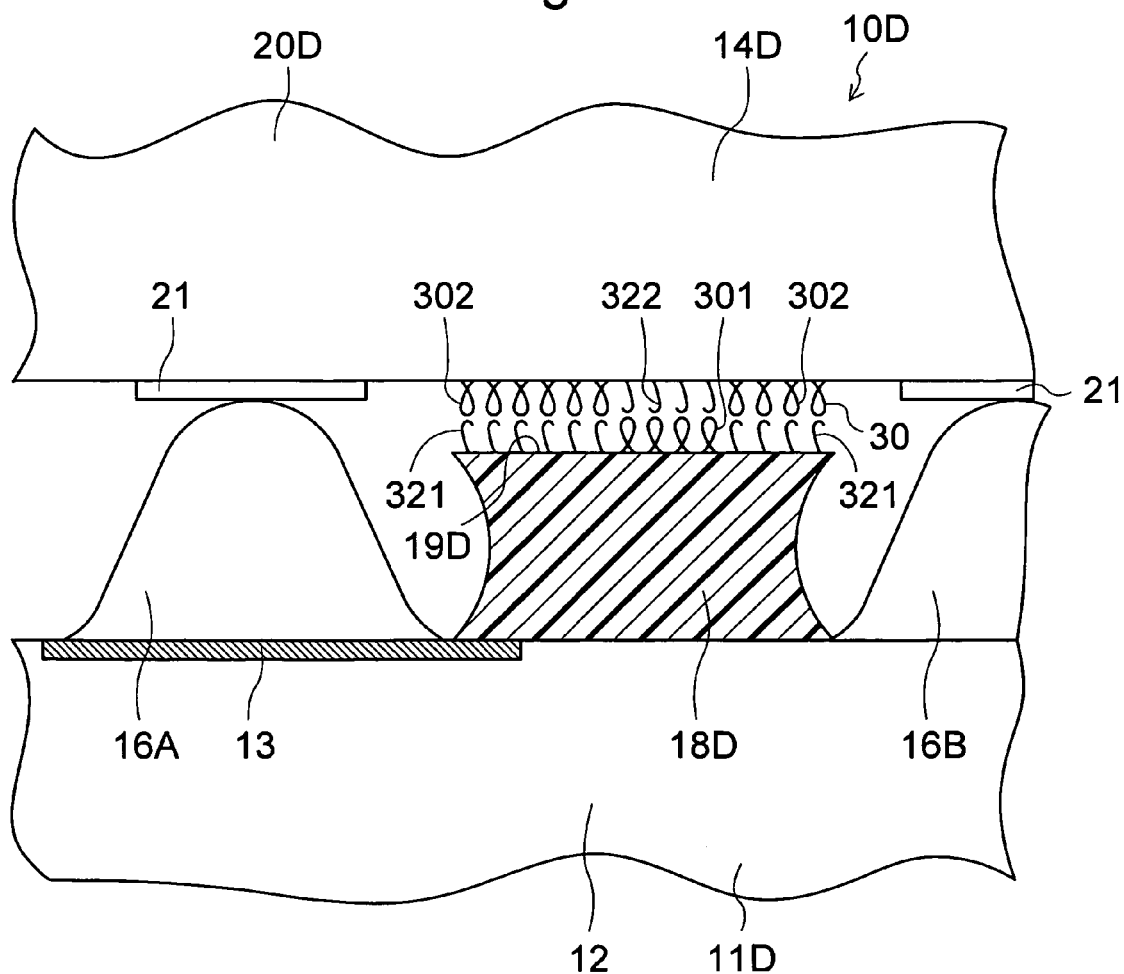
FIG. 9 is an enlarged cross-sectional view showing a wiring board structure according to a fifth embodiment of the embodiment.

FIG. 9 shows an enlarged cross-sectional view of the wiring structure 10D according to the fifth embodiment of the present invention.

This embodiment differs from the first embodiment in the structure of the holding members 18D of the connector 11D and the structure of the base member 20D of the wiring board 14D.

Specifically, on the affixing surface 19D of each holding member 18D are provided with a plurality of hooks 321 and a plurality of loops 301. Meanwhile, on a portion of the base member 20D of the wiring board 14D, to which the affixing surface 19D of the holding member 18D is to be attached, there are provided a plurality of loops 302 to be engaged with the hooks 321 of the holding member 18D and hooks 322 to be engaged with the loops 301 of the holding member 18D.

Therefore, according to the embodiment, the holding members 18D can be attached to the wiring board 14D reliably.

Sixth Embodiment

Figure 10:
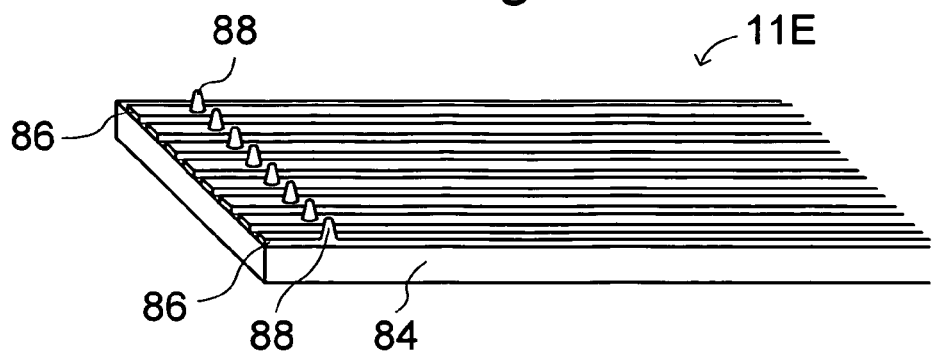
FIG. 10 is a perspective view showing the state where pressing members have been formed in a connector according to a sixth embodiment of the present invention
Figure 11:
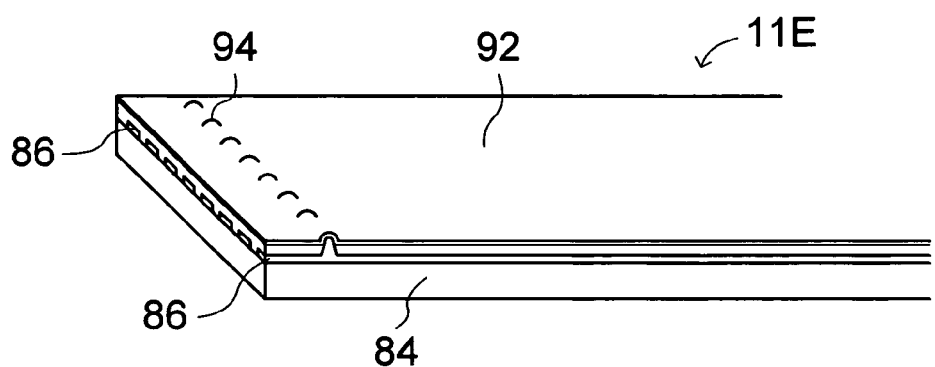
FIG. 11 is a perspective view showing the state where the pressing members have been covered over in the connector according to the above-described embodiment.
Figure 12:
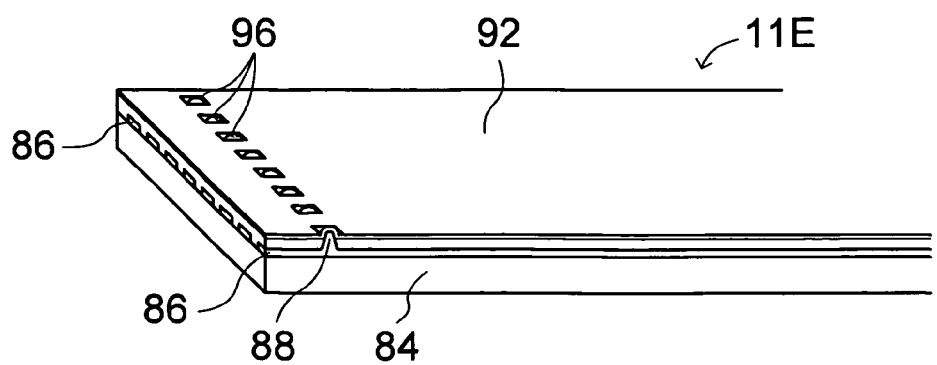
FIG. 12 is a perspective view showing the state where the pressing members have been exposed in the connector according to the embodiment.

FIGS. 10 to 12 show the procedures for manufacturing a connector 11E according to a sixth embodiment of the present invention First, wires 86 are formed with a conductive material on a base member 84 formed with an elastomer, followed by forming pressing members 88 partially on the wires 86, as shown in FIG. 10.

Next, an adhesive material is applied to the base member 84 over the whole surface thereof thereby to form a sticky layer 92 as shown in FIG. 11. Thus, the sticky layer 92 is also formed on the pressing members 88 and therefore protrusions 94 are formed. In this case, the sticky layer 92 may be formed by overlaying a sticky sheet thereon.

Next, the sticky layer 92, which forms the protrusions 94, is removed by irradiation of ultraviolet light or the like to form rectangular openings 96 so as to expose the pressing members 88 as shown in FIG. 12. The method for removing the sticky layer 92 is not limited to a method by irradiation of ultraviolet light, and the sticky layer may be cut off using a cutter or the like.

Seventh Embodiment

Figure 13:
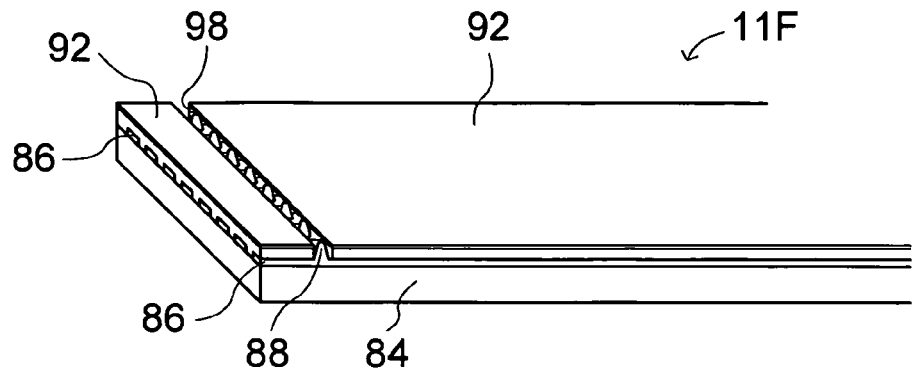
FIG. 13 is a perspective view showing a connector according to a seventh embodiment of the present invention

FIG. 13 shows a connector 11F according to the seventh embodiment of the present invention.

This embodiment differs from the sixth embodiment in that a belt-shaped opening 98 is formed by connecting the rectangular openings 96 without interruption.

Eighth Embodiment

Figure 14:
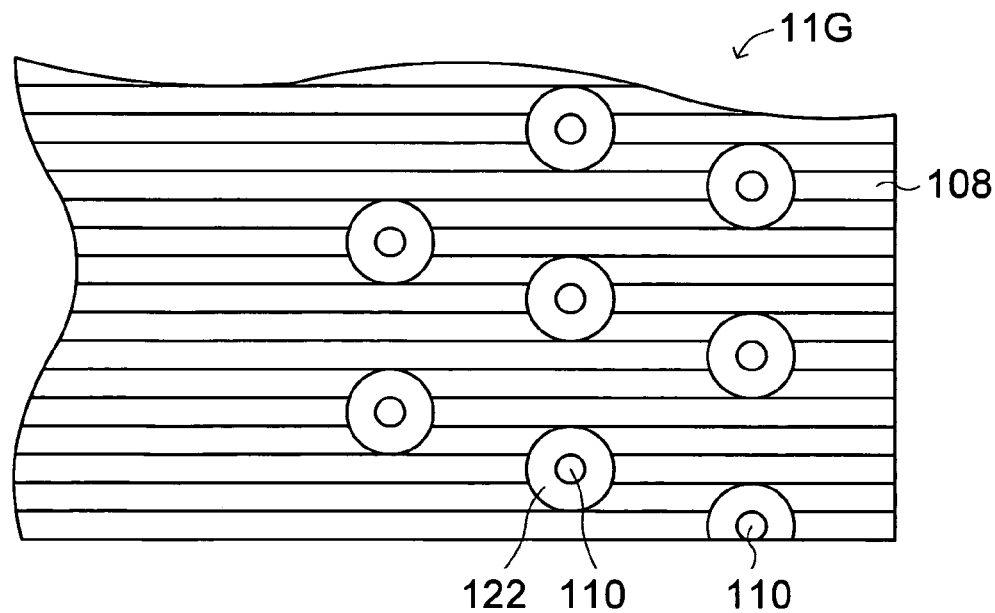
FIG. 14A is a plan view showing a connector according to an eighth embodiment of the present invention
FIG. 14B is a cross-sectional view of the connector according to the embodiment.
Figure 14:
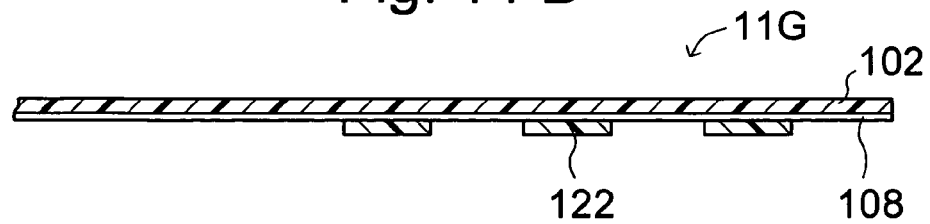

FIGS. 14A and 14B show a connector 11G according to the eighth embodiment of the present invention.

Figure 15:
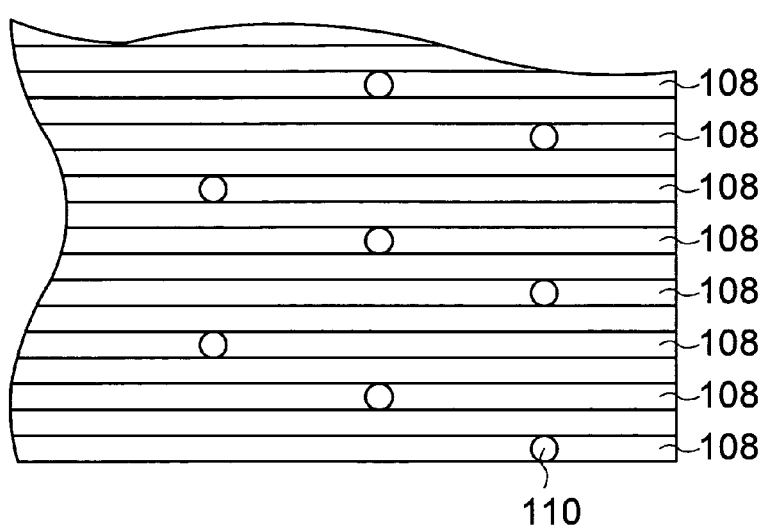
FIG. 15A is a plan view showing the state where holding members haven't been formed yet in the connector according to the embodiment.
FIG. 15B is a transverse cross-sectional view showing the state where the holding members haven't been formed yet in the connector according to the embodiment.
FIG. 15C is a longitudinal cross-sectional view showing the state where holding members haven't been formed yet in the connector according to the embodiment.
Figure 15:
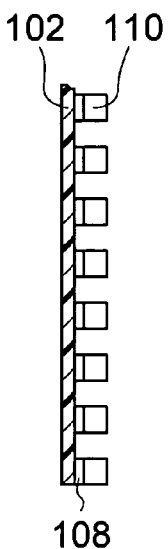
Figure 15:
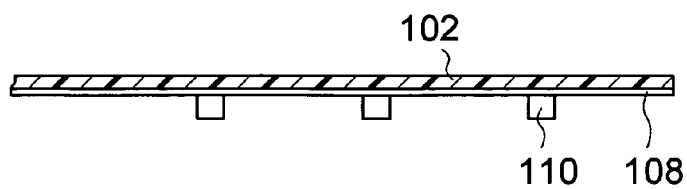

In this embodiment, first a base member 102 is formed with an elastomer, followed by forming conductive wires 108 on the base member 102 and column-shaped pressing members 110 on portions of the wires 108, as shown in FIGS. 15A, 15B, and 15C.

Next, as shown FIGS. 14A and 14B, a hollow cylinder-shaped holding member 122 is formed with an adhesive material surrounding each columnar pressing member 110. Here, the pressing members 110 are slightly larger than the holding members 122 in height.

Figure 16:
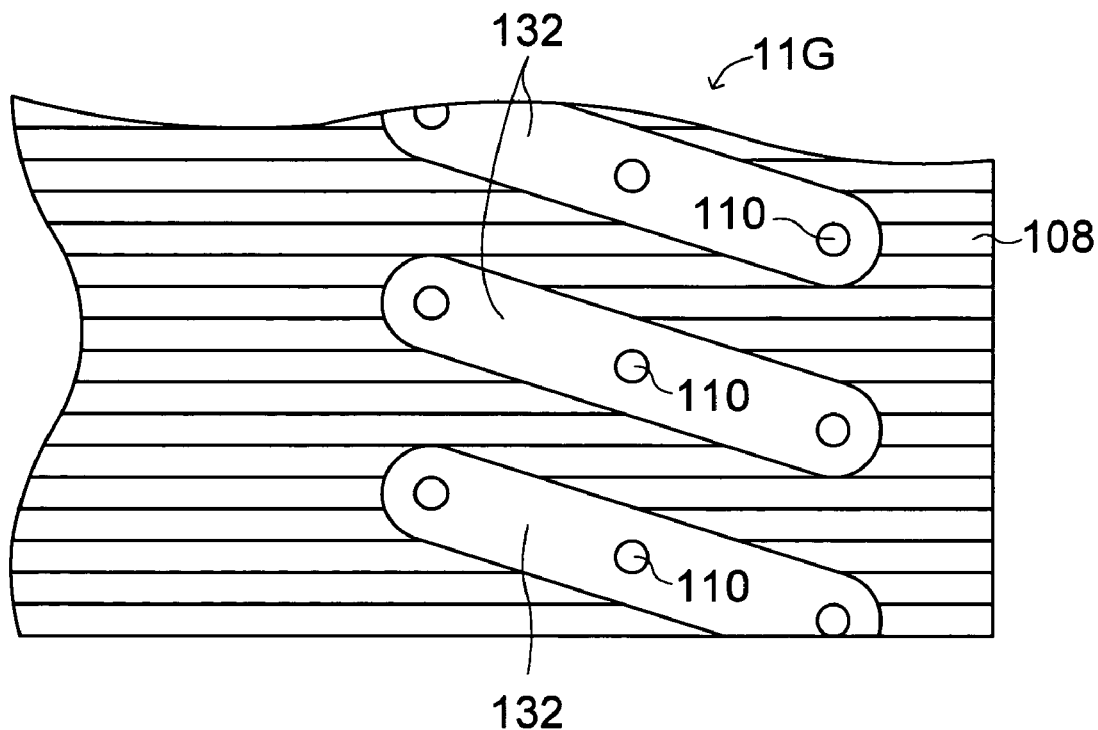
FIG. 16A is a plan view showing a modified example of the connector according to the embodiment.
FIG. 16B is a cross-sectional view showing the modification example of the connector according to the embodiment.
Figure 16:
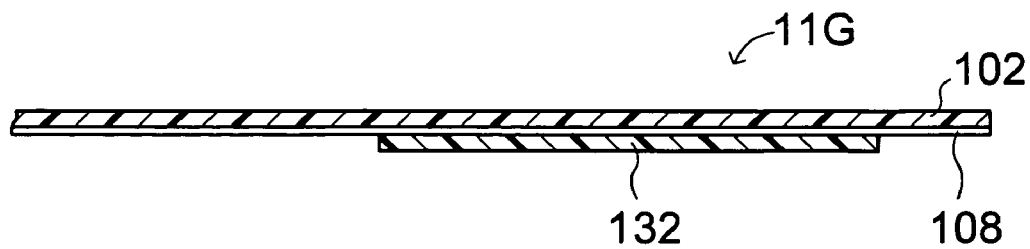

Alternatively, holding members 132 in the belt form surrounding a plurality of pressing members 110 respectively may be formed as shown in FIG. 16. Specifically, each holding member 132 surrounds three pressing members 110 disposed slantwise with respect to the longitudinal direction of the wires 108.

Ninth Embodiment

FIGS. 17A and 17B show a connector 11H according to the ninth embodiment of the present invention.

This embodiment differs from the eighth embodiment in the structure of a holding member 142. Specifically, the holding member 142 is formed over the entire surface except for the portions where pressing members 110 are provided. Accordingly, the center of a circular opening 144 formed in the holding member 142 substantially coincides with the center of the pressing member 110. In addition, the holding member 142 is higher than the pressing members 110 by a size of t.

Tenth Embodiment

FIGS. 18A and 18B show a connector 11I according to the tenth embodiment of the present invention.

This embodiment differs from the eighth embodiment in the structure of a holding member 152. Specifically, the holding member 152 is formed over the entire surface except for the portions where pressing members 110 are provided. Accordingly, the holding member 152 has belt-shaped openings 154 formed therein; the openings 154 surround three pressing members 110 disposed slantwise with respect to the longitudinal direction of the wires 108. In addition, the holding member 152 is larger than the pressing members 110 in height by a size of t.

The invention is not limited the above-described embodiments, and may include modifications and improvements within a scope of achieving the object of the present invention.

The connector and the method for manufacturing the connector according to the invention as well as a wiring board structure employing this connector can offer the following effects.

Pressing members of the connector are brought into contact with the wires on the wiring board, whereby the wires of the connector are electrically connected to the wires on the wiring board through the pressing members. At this time, the pressing members can be brought into contact with the wiring boards reliably because a holding member is provided in a portion other than those of the pressing members. Therefore, the wires provided on a surface of the wiring board can be made flat, and it becomes possible to secure the flexibility in designing a wiring pattern of a wiring board. In addition, since the holding member of the connector can be attached to the wiring board, the relative displacement between the connector and wiring board can be prevented and therefore the connector can be reliably connected to the wiring board.

The invention claimed is:

1. A connector which is connectable to a wiring board being composed of a non-conductive base member and a conductive wire provided on a surface of the base member, the connector comprising:

a conductive pressing member provided on and protruding from said wire; and a couple of holding members provided on and protruding from a portions in the surface of said base member except where said pressing member is located, the holding members sandwiching said pressing member, having an affixing surface attachable to said wiring board wherein, said holding member is lower than said pressing member in height and when said pressing member presses on said wiring board said couple of holding members is pulled by said connector and said wiring board and stretched; and wherein at least one of said pressing member, said holding member, and said base member and said wiring board is consisting of elastic material and deformable to create a couple of pressing and stretching forces between said pressing member and said holding members with elastically restoring forces.

2. The connector according to claim 1, wherein the affixing surface of said holding member is concaved.

3. The connector according to claim 1, wherein the affixing surface of said holding member is arranged so as to be adhered to said wiring board.

4. The connector according to claim 3, wherein the affixing surface of said holding member is arranged so as to be attachable to and removable from said wiring board.

5. The connector according to claim 1, wherein the affixing surface of said holding member is arranged so as to be engageable with said wiring board.

6. A wiring board structure having a wiring board and a connector to be connected to the wiring board, wherein said connector comprises:
      a non-conductive base member;
      a conductive wire provided on a surface of said base member;
      a conductive pressing member provided on and protruding from the wire; and
      a holding member provided on and protruding from a portion in the surface of said base member except where said pressing member is located, the holding member having an affixing surface attachable to said wiring board, wherein said wiring board comprises:
      a non-conductive base member and
      a conductive wire provided on the surface of said base member, and wherein when said connector is superposed on said wiring board in an opposing manner, the pressing member of said connector is brought into contact with the wire on said wiring board, and said holding member is attached to said wiring board;

wherein when said holding member pulls said wiring board, said pressing member is compressed by said connector and said wiring board;

wherein when said pressing member presses on said wiring board, said holding member is pulled by said connector and said wiring board and stretched; and wherein said wiring board is deformed when said pressing member presses on said wiring board, and said holding member pulls said wiring board.

7. The wiring board structure according to claim 6, wherein said holding member has wider shape toward said affixing surface.

8. The wiring board structure according to claim 6, wherein said connector is deformed when said pressing member presses on said wiring board and said holding member pulls said wiring board.

9. A wiring board structure having a wiring board and a connector to be connected to the wiring board,
wherein said connector comprises:
a non-conductive base member;
a conductive wire provided on a surface of said base member;
a conductive pressing member provided on and protruding from the wire; and
a holding member provided on and protruding from a portion in the surface of said base member except where said pressing member is located, the holding member having an affixing surface attachable to said wiring board,
wherein said wiring board comprises:
a non-conductive base member and
a conductive wire provided on the surface of said base member, and
wherein when said connector is superposed on said wiring board in an opposing manner, the pressing member of said connector is brought into contact with the wire on said wiring board, and said holding member is attached to said wiring board;

wherein said holding member pulls said wiring board, said pressing member is compressed by said connector and said wiring board;

wherein when said pressing member presses on said wiring board, said holding member is pulled by said connector and said wiring board and stretched; and wherein said wiring board is deformed when said pressing member presses on said wiring board, and said holding member pulls said wiring board.

10. The connector according to claim 1, wherein the affixing surface of said holding member is concaved.

11. The connector according to claim 1, wherein the affixing surface of said holding member is arranged so as to be adhered to said wiring board.

12. The connector according to claim 2, wherein the affixing surface of said holding member is arranged so as to be adhered to said wiring board.

13. The connector according to claim 11, wherein the affixing surface of said holding member is arranged so as to be attachable to and removable from said wiring board.

14. The connector according to claim 1, wherein the affixing surface of said holding member is arranged so as to be engageable with said wiring board.

15. The connector according to claim 2, wherein the affixing surface of said holding member is arranged so as to be engageable with said wiring board.

16. The wiring board structure according to claim 11, wherein when said holding member pulls said wiring board, said pressing member is compressed by said connector and said wiring board.

* * * * *